United States Patent
Kang et al.

(10) Patent No.: US 8,681,536 B2
(45) Date of Patent: Mar. 25, 2014

(54) MAGNETIC TUNNEL JUNCTION (MTJ) ON PLANARIZED ELECTRODE

(75) Inventors: Seung H. Kang, San Diego, CA (US); Xia Li, San Diego, CA (US); Wei-Chuan Chen, San Diego, CA (US); Kangho Lee, San Diego, CA (US); Xiaochun Zhu, San Diego, CA (US); Wah Nam Hsu, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 154 days.

(21) Appl. No.: 12/777,529

(22) Filed: May 11, 2010

(65) Prior Publication Data
US 2011/0175181 A1    Jul. 21, 2011

Related U.S. Application Data

(60) Provisional application No. 61/295,460, filed on Jan. 15, 2010.

(51) Int. Cl.
*G11C 11/22*  (2006.01)

(52) U.S. Cl.
USPC ............. 365/158; 257/E21.665; 365/225.5

(58) Field of Classification Search
USPC ....... 257/E21.665, 421; 365/225.5, 158, 171, 365/173
See application file for complete search history.

(56) References Cited

U.S. PATENT DOCUMENTS

| 2003/0151859 | A1 | 8/2003 | Hayashi et al. |
| 2006/0092698 | A1 | 5/2006 | Jeong et al. |
| 2008/0225576 | A1* | 9/2008 | Zhong et al. ............... 365/158 |
| 2009/0027811 | A1* | 1/2009 | Guo ............................ 360/324.2 |
| 2009/0039451 | A1 | 2/2009 | Ueno et al. |
| 2009/0227045 | A1* | 9/2009 | Li .................................... 438/3 |
| 2009/0261433 | A1 | 10/2009 | Kang et al. |
| 2009/0261434 | A1* | 10/2009 | Kang et al. .................... 257/421 |
| 2009/0261437 | A1* | 10/2009 | Kang et al. .................... 257/422 |
| 2010/0065935 | A1* | 3/2010 | Horng et al. ................... 257/421 |
| 2010/0102404 | A1* | 4/2010 | Li et al. ......................... 257/421 |
| 2010/0117169 | A1* | 5/2010 | Anderson et al. ............. 257/421 |
| 2010/0181633 | A1* | 7/2010 | Nam et al. ..................... 257/421 |
| 2010/0264501 | A1 | 10/2010 | Furuta et al. |
| 2011/0049654 | A1* | 3/2011 | Li et al. ......................... 257/421 |
| 2011/0062536 | A1* | 3/2011 | Min et al. ...................... 257/421 |
| 2011/0141796 | A1* | 6/2011 | Lee et al. ....................... 365/158 |

FOREIGN PATENT DOCUMENTS

| KR | 20090014958 A | 2/2009 |
| WO | WO2008105372 A1 | 9/2008 |
| WO | WO2009129283 | 10/2009 |
| WO | WO2010051010 A1 | 5/2010 |

OTHER PUBLICATIONS

International Search Report and Written Opinion—PCT/US2011/021352, ISA/EPO—May 10, 2011.
Taiwan Search Report—TW100101557—TIPO—Jul. 24, 2013.

* cited by examiner

*Primary Examiner* — Fernando L. Toledo
*Assistant Examiner* — Peter Bradford
(74) *Attorney, Agent, or Firm* — Sam Talpalatsky; Nicholas J. Pauley; Joseph Agusta (57) ABSTRACT

A magnetic tunnel junction (MTJ) with direct contact is manufactured having lower resistances, improved yield, and simpler fabrication. The lower resistances improve both read and write processes in the MTJ. The MTJ layers are deposited on a bottom electrode aligned with the bottom metal. An etch stop layer may be deposited adjacent to the bottom metal to prevent overetch of an insulator surrounding the bottom metal. The bottom electrode is planarized before deposition of the MTJ layers to provide a substantially flat surface. Additionally, an underlayer may be deposited on the bottom electrode before the MTJ layers to promote desired characteristics of the MTJ.

12 Claims, 7 Drawing Sheets

MAGNETIC TUNNEL JUNCTION (MTJ) ON PLANARIZED ELECTRODE

PRIORITY CLAIM

This application claims the benefit of U.S. Provisional Patent Application No. 61/295,460 entitled "Magnetic Tunnel Junction (MTJ) on Planarized Electrode" to KANG et al., filed Jan. 15, 2010.

TECHNICAL FIELD

The present disclosure generally relates to memory devices. More specifically, the present disclosure relates to magnetic random access memory (MRAM).

BACKGROUND

Unlike conventional random access memory (RAM) chip technologies, in magnetic RAM (MRAM) data is not stored as electric charge, but is instead stored by magnetic polarization of storage elements. The storage elements are formed from two ferromagnetic layers separated by a tunneling layer. One of the two layers has at least one pinned magnetic polarization (or fixed layer) set to a particular polarity. The magnetic polarity of the other magnetic layer (or free layer) is altered to represent either a "1" (i.e., anti-parallel polarity to the fixed layer) or "0" (i.e., parallel polarity to the fixed layer). One such device having a fixed layer, a tunneling layer, and a free layer is a magnetic tunnel junction (MTJ). The electrical resistance of an MTJ is dependent on the magnetic polarity of the free layer compared to the magnetic polarity of the fixed layer. A memory device such as MRAM is built from an array of individually addressable MTJs.

Conventionally, the MTJ contacts a bottom metal through a bottom electrode. The bottom electrode contacts the bottom metal through a minimal-feature opening. The MTJ is placed on the bottom electrode in a location away from contact to the bottom metal to reduce surface roughness in the MTJ. Thus, the bottom electrode is extended larger in width than the size of the MTJ. As a result, a high resistance results from increased contact resistance of the bottom electrode. Additionally, increased area overhead and bitcell size result from the extended width of the bottom electrode.

As bit cell sizes decrease, the size of the contact to the bottom metal decreases and reduces manufacturing reliability. Additionally, resistances increase as bitcell sizes decrease due to challenges in seeding and filling the bottom metal. Increased resistance results in a loss of sensitivity in conventional MTJs.

Thus, there is a need for a MTJ having a smaller bitcell size and lower resistivity.

BRIEF SUMMARY

According to one aspect of the disclosure, a magnetic tunnel junction (MTJ) includes a bottom metal. The MTJ also includes a bottom electrode on the bottom metal. The MTJ further includes a material stack on the bottom electrode. The material stack being smaller than the bottom electrode and aligned substantially with the bottom metal. The MTJ also includes a top electrode on the material stack.

According to another aspect of the disclosure, a process for manufacturing a magnetic tunnel junction device includes depositing a second insulating layer around a bottom metal and on a first insulating layer. The process also includes patterning the second insulating layer to expose the bottom metal. The process further includes depositing a bottom electrode on the bottom metal to cover the bottom metal after patterning the second insulating layer. The process also includes planarizing the bottom electrode. The process further includes depositing MTJ layers on the bottom electrode after planarizing the bottom electrode.

According to a further aspect of the disclosure, a process for manufacturing a magnetic tunnel junction device includes depositing a second insulating layer around a bottom metal and on a first insulating layer. The process also includes patterning the second insulating layer to expose the bottom metal. The process further includes depositing a bottom electrode on the bottom metal to cover the bottom metal after patterning the second insulating layer. The process also includes planarizing the bottom electrode. The process further includes depositing MTJ layers on the bottom electrode after planarizing the bottom electrode.

According to another aspect of the disclosure, a magnetic tunnel junction (MTJ) includes a bottom metal. The MTJ also includes means for coupling on the bottom metal. The MTJ further includes a material stack on the coupling means. The material stack being patterned to a size smaller than the coupling means and the material stack being aligned substantially with the bottom metal. The MTJ also includes a top electrode on the material stack.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

A magnetic tunnel junction (MTJ) device may be manufactured having a large contact opening for a bottom electrode of the MTJ to allow direct contact of the MTJ with a bottom metal. The large contact opening allows smaller bit cell sizes and higher yields. Smaller bit cell sizes reduce total die area of a magnetic random access memory (MRAM) device including MTJ devices with direct contact. Additionally, the MTJ device is placed on the bottom electrode substantially aligned with the bottom metal. Placing the MTJ device substantially aligned with the bottom metal reduces contact resistance and enhances sensitivity of the MTJ device. Manufacturing MTJ devices with direct contact also simplifies integration and manufacturing processes to achieve higher yields.

Figure 1A:
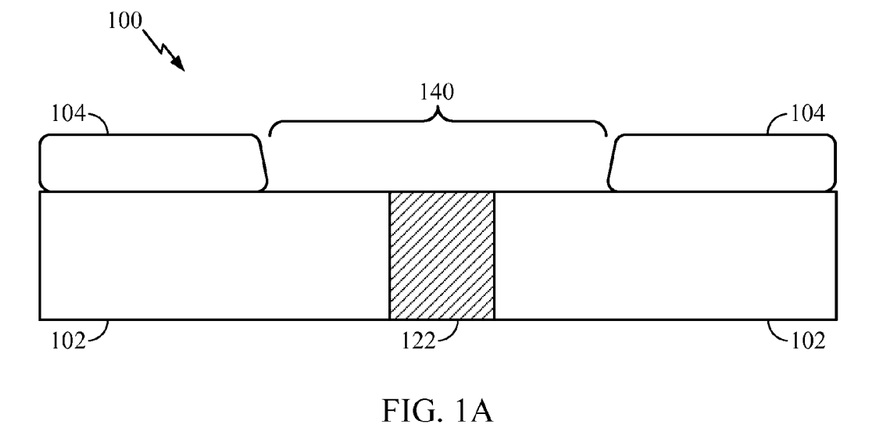
FIGS. 1A-1H are cross-sectional views illustrating manufacturing an MTJ with direct contact according to one embodiment.

FIGS. 1A-1H are cross-sectional views illustrating manufacturing an MTJ with direct contact according to one embodiment. FIG. 1A illustrates a partially-complete MTJ device after insulator deposition and patterning. An insulator 104 is deposited on an insulator 102. The insulator 102 surrounds a bottom metal 122, which may have an adjustable width. The insulator 104 is patterned using a first mask to create an opening 140 that exposes the bottom metal 122 for contact to a bottom electrode 124.

Figure 1B:
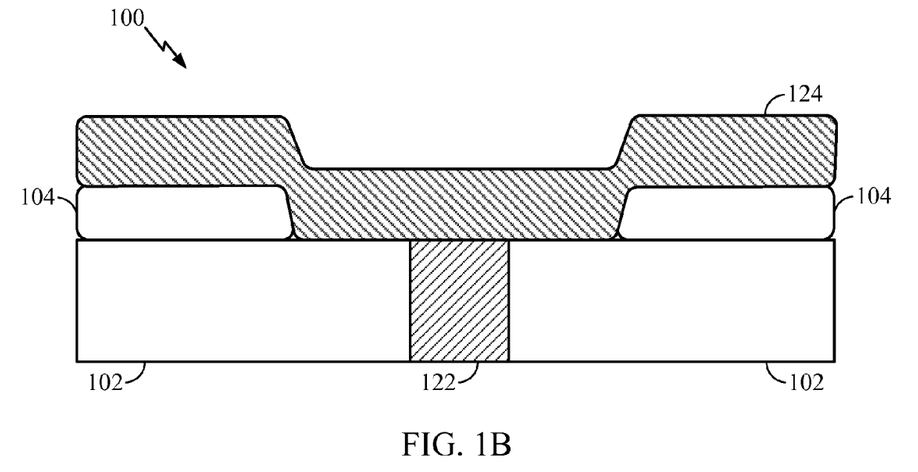

FIG. 1B illustrates a partially-complete MTJ device after bottom electrode deposition according to one embodiment. A bottom electrode 124 is deposited on the insulator 104, the insulator 102, and the bottom metal 122 and may be, for example, tantalum, copper, tungsten, tantalum nitride, or a tantalum nitride/tantalum bilayer. According to one embodiment, if tungsten or copper are selected for the bottom electrode 124, higher conductivity and lower resistivity are achieved. Additionally, tungsten and copper are easier to planarize than other conducting metals. The bottom electrode 124 contacts the bottom metal 122 in the opening 140 patterned in FIG. 1A. In another embodiment, the contact sidewall and bottom interfaces are covered by a diffusion barrier.

The large contact between the bottom electrode 124 and the bottom metal 122 reduces contact resistance. Lower resistances improve both read and write processes for an MTJ device 100. For example, during a read operation sensitivity is the change in resistance of the MTJ device 100 divided by the total resistance of the MTJ device 100. Decreasing the total resistance of the MTJ device 100 with a larger contact increases the relative contribution of resistance change. Additionally, during a write operation, voltage drop is reduced across the contact of the bottom metal 122 to the bottom electrode 124, reducing the amount of supply voltage used for write operations. Reduced supply voltage during write operations increases reliability of the MTJ device 100 and reduces power consumption by the MTJ device 100.

Figure 1C:
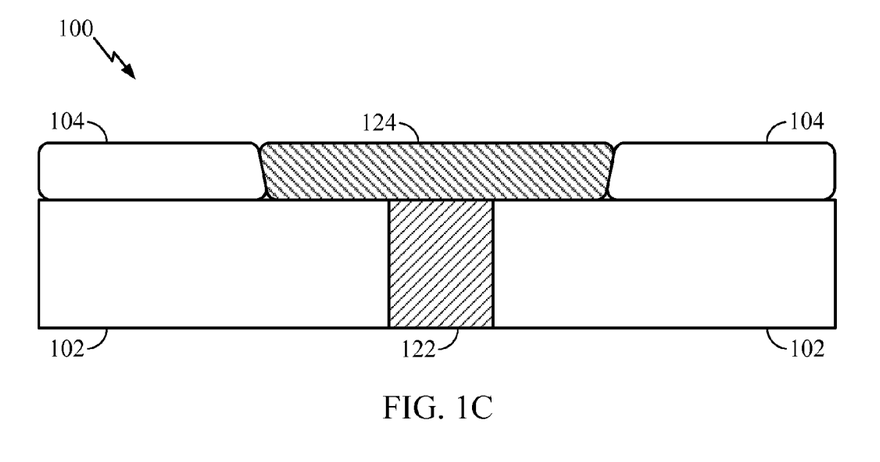

FIG. 1C illustrates a partially-complete MTJ device after bottom electrode planarization according to one embodiment. The bottom electrode 124 is planarized using, for example, chemical mechanical polishing to substantially remove the bottom electrode 124 from the insulator 104. Additionally, planarization of the bottom electrode 124 creates a substantially flat surface on the bottom electrode 124 for MTJ layers (not yet shown).

Figure 1D:
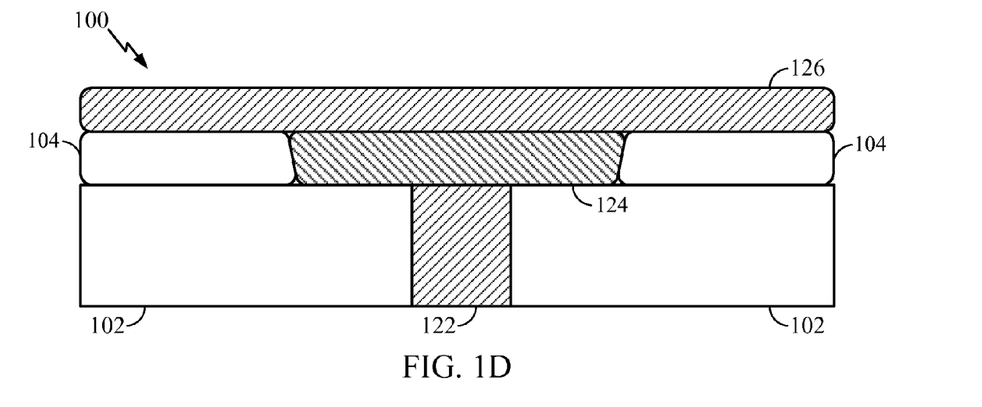

FIG. 1D illustrates a partially-complete MTJ device after MTJ layer deposition. MTJ layers 126 may be, for example, a ferromagnetic layer/tunnel barrier layer/ferromagnetic layer multilayer stack. According to one embodiment, the MTJ layers 126 are antiferromagnet/synthetic antiferromagnetic reference layer/tunnel barrier/free layer, for example, PtMn/CoFe/Ru/CoFeB/MgO/CoFeB. Additionally, a capping layer (not shown) may be placed on the MTJ layers 126. A substantially flat surface of the bottom electrode 124 decreases surface roughness of the MTJ layers 126 and improves magnetic and electrical properties of the MTJ device 100. According to one embodiment, the MTJ layers 126 are deposited in a specialized MTJ tool after transfer from back-end-of-line (BEOL) equipment.

Figure 1E:
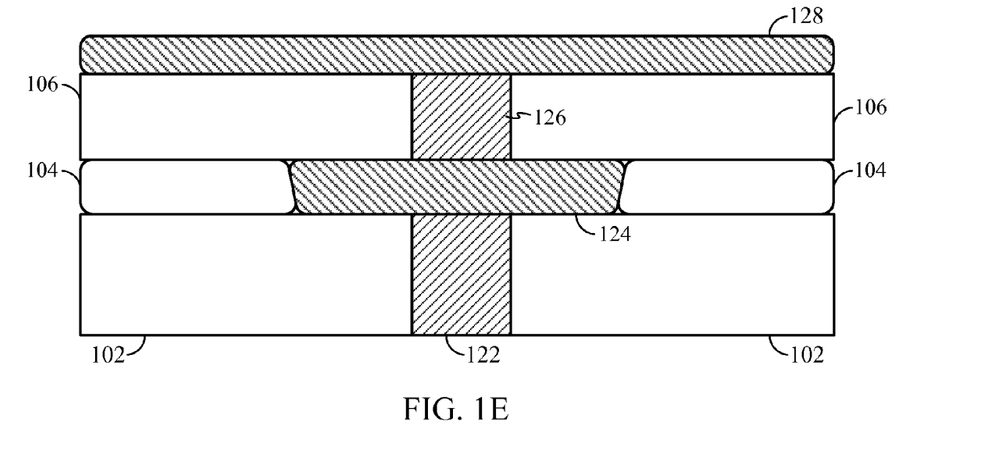

FIG. 1E illustrates a partially-complete MTJ device after top electrode layer deposition according to one embodiment. The MTJ layers 126 are patterned using a second mask. The location of the patterned MTJ layers 126 is substantially aligned with the bottom metal 122. After patterning, an insulator 106 is deposited surrounding the MTJ layers 126. According to one embodiment, the insulator 106 is deposited and etched back level with the MTJ layers 126. A top electrode 128 is deposited on the MTJ layers 126 and the insulator 106. The top electrode 128 may be, for example, tantalum, tantalum nitride, titanium, or titanium nitride.

Figure 1F:
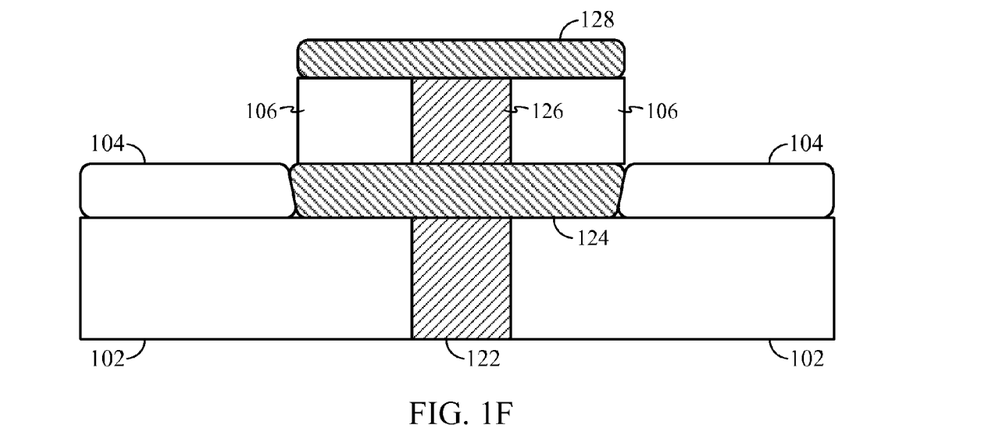

FIG. 1F illustrates a partially-complete MTJ device after top electrode patterning according to one embodiment. The top electrode 128 is patterned using a third mask. The top electrode 128 may be a different size than the bottom electrode 124 (although same sizes are shown). A size of the top electrode 128 determines, in part, the size of the insulator 106 remaining on sides of the MTJ layers 126. A larger top electrode 128 results in a larger amount of insulator 106 located immediately surrounding the MTJ layers 126 during etching of the insulator 106. Thus, sidewalls of the MTJ layers 126 receive more protection from the insulator 106 for a larger top electrode 128 than for a smaller top electrode 128. The top electrode 128 should be large enough so that the corresponding insulator 106 protects the sidewalls of the MTJ layer 126. According to one embodiment, the top electrode 128 may be 100-200 nm in width.

Figure 1G:
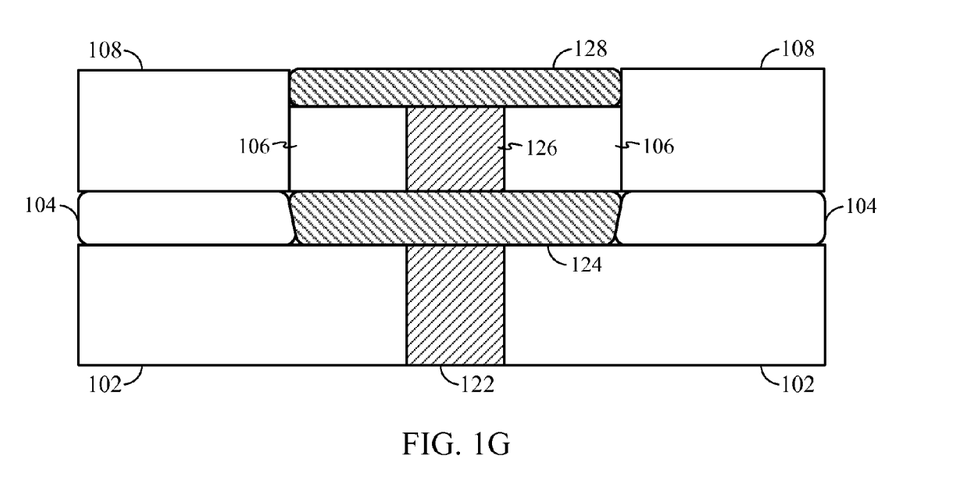

FIG. 1G illustrates a partially-complete MTJ device after insulator deposition according to one embodiment. An insulator 108 is deposited to surround the insulator 106 and the top electrode 128. According to one embodiment, the insulator 108 is deposited and etched back level with the top electrode 128.

Figure 1H:
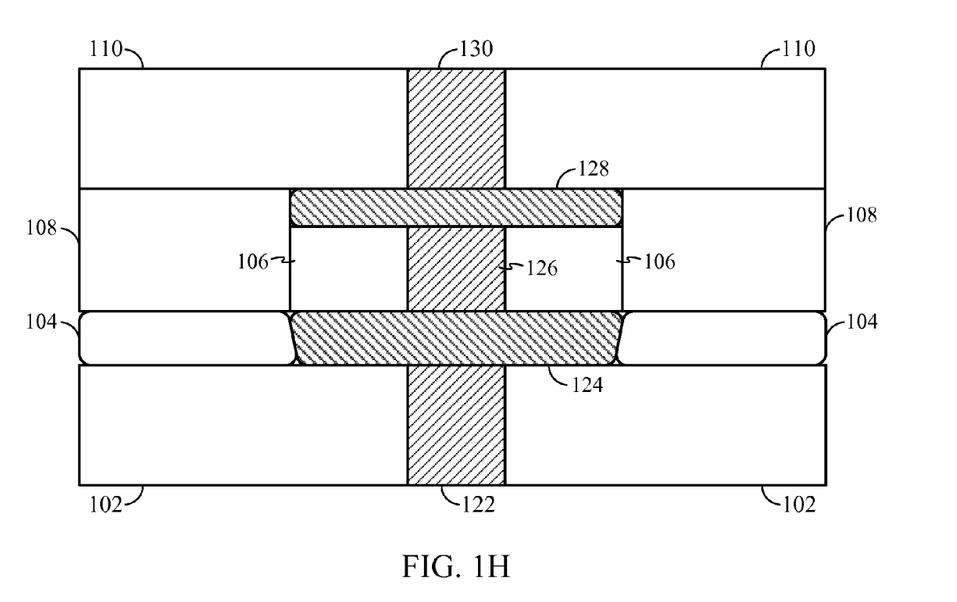

FIG. 1H illustrates a partially-complete MTJ device after top metal formation according to one embodiment. An insulator 110 and top metal 130 are deposited on the top electrode 128 and the insulator 108 such that the top metal 130 forms an electrical contact with the top electrode 128. According to one embodiment, the insulator 110 may be deposited and an opening for the top metal 130 patterned followed by deposition of the top metal 130 into the opening. The top metal 130 may be, for example, copper or aluminum.

An electrical path is formed between the top metal 130, the top electrode 128, the MTJ layers 126, the bottom electrode 124, and the bottom metal 122. The electrical path may be used for passing sensing currents for read operations and/or writing currents for write operations of the MTJ device 100.

Figure 2:
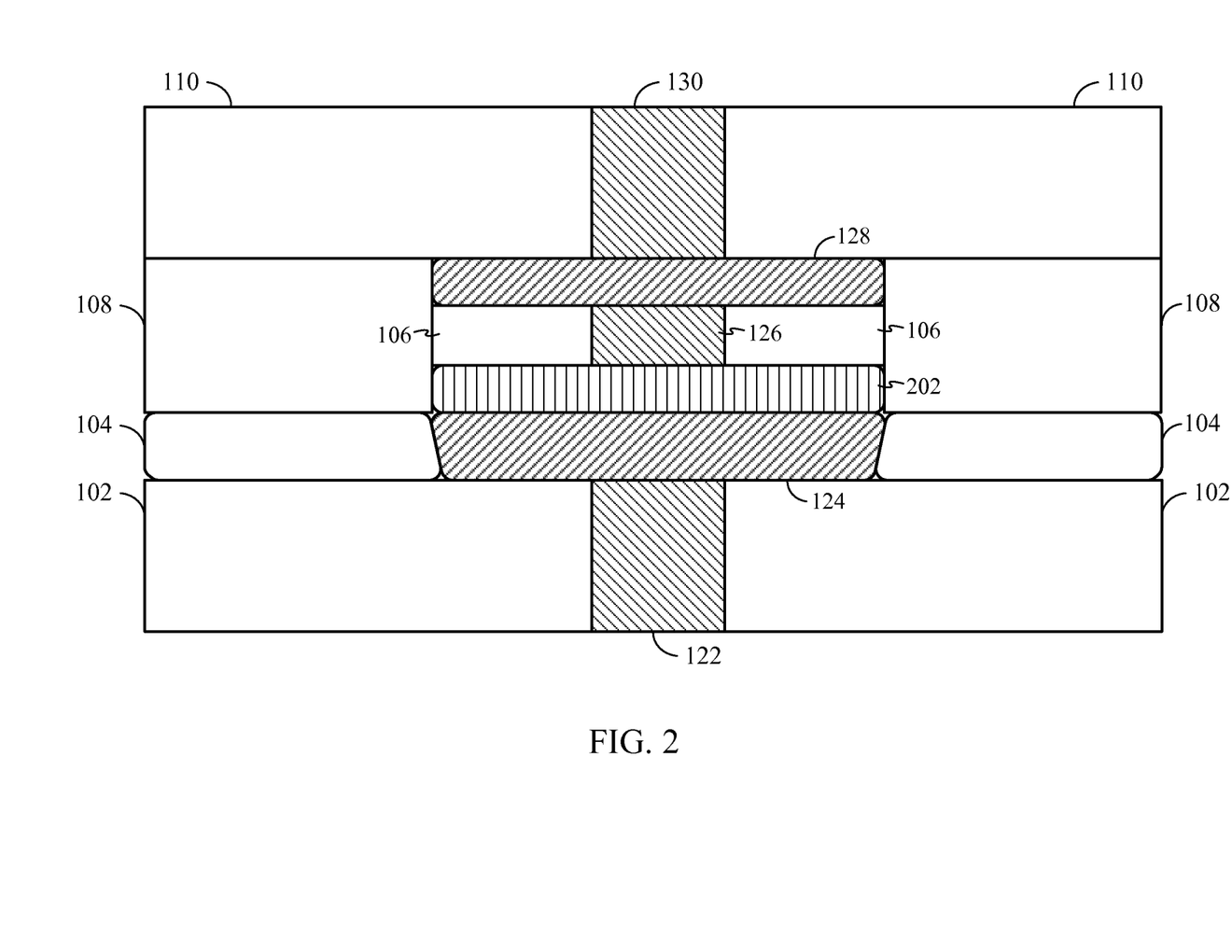
FIG. 2 is a cross-sectional view illustrating an MTJ device with direct contact having an underlayer according to one embodiment.

FIG. 2 is a cross-sectional view illustrating an MTJ device with direct contact having an underlayer according to one embodiment. An underlayer 202 may be deposited on the bottom electrode 124 to promote desirable MTJ microstructure (e.g., particular crystalline structure). The underlayer 202 may be, for example, tantalum. The underlayer 202 may be patterned using the second mask or the third mask. According to an embodiment using the second mask, the underlayer 202 is substantially the same size as the MTJ layers 126. According to an embodiment using the third mask, the underlayer 202 is substantially the same size as the top electrode 128. Additionally, the width of the bottom metal 122 is adjustable.

Figure 3:
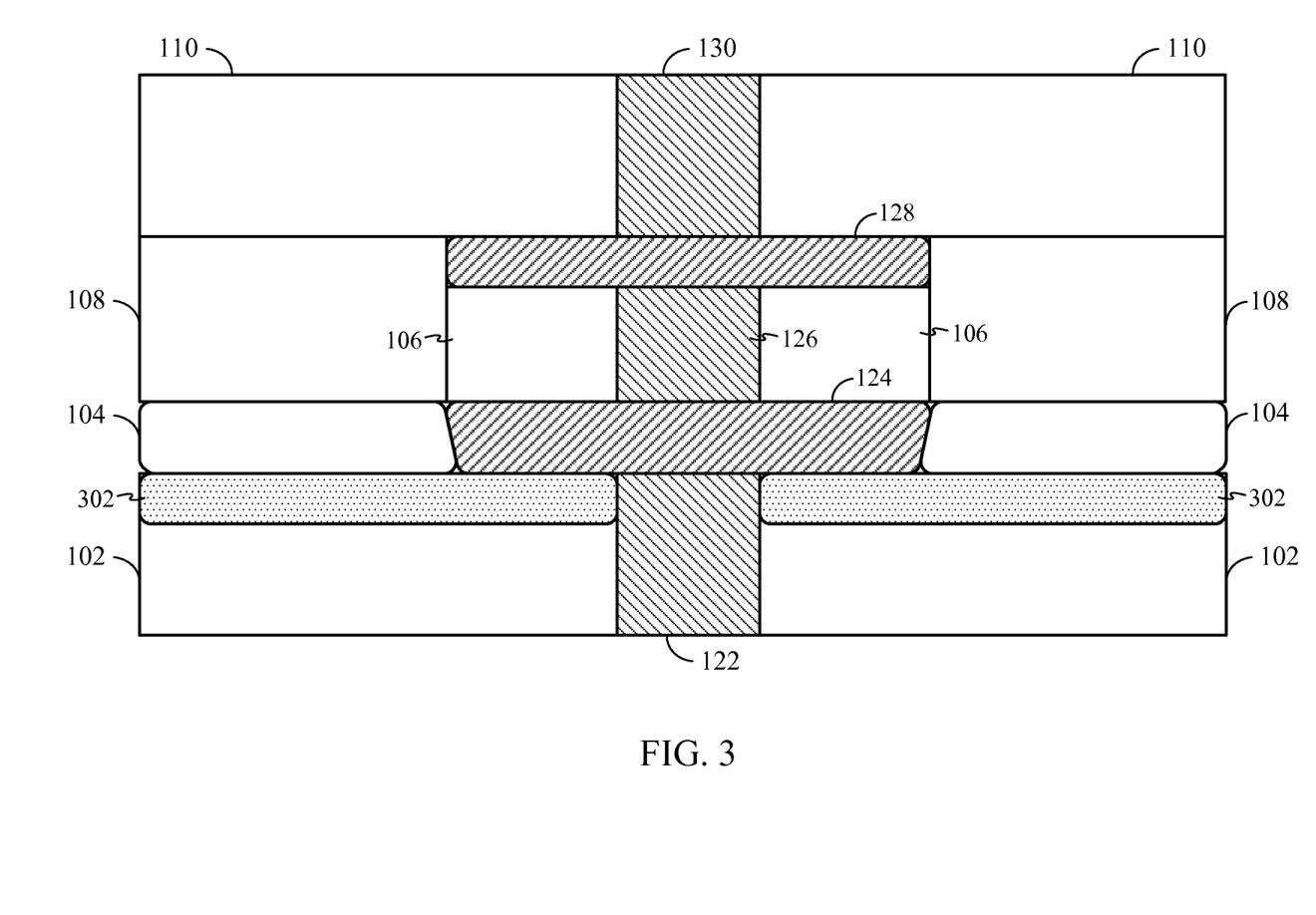
FIG. 3 is a cross-sectional view illustrating an MTJ device with direct contact having an etch stop layer according to one embodiment.

FIG. 3 is a cross-sectional view illustrating an MTJ device with direct contact having an etch stop layer according to one embodiment. An etch stop layer 302 may be deposited on the insulator 102 to prevent etching of the insulator 102 during patterning of the insulator 104. That is, during overetching of the insulator 104 the insulator 102 may be etched resulting in surface roughness and undesirable electrical characteristics of the later patterned bottom electrode 124, the MTJ layers 126, and the top electrode 128. The etch stop layer 302 deposited on the insulator 102 etches at a decreased rate in comparison to the insulator 104 to substantially reduce etching of the insulator 102. Additionally, the bottom metal 122 width is adjustable.

An MTJ with direct contact as disclosed above allows smaller bit cell size and higher yield. Additionally, a large contact opening filled with a planarized bottom electrode reduces contact resistance of the MTJ. Reduced contact resistance improves both read and write processes. A manufacturing process for the MTJ with direct contact has simple integration and high yield.

Figure 4:
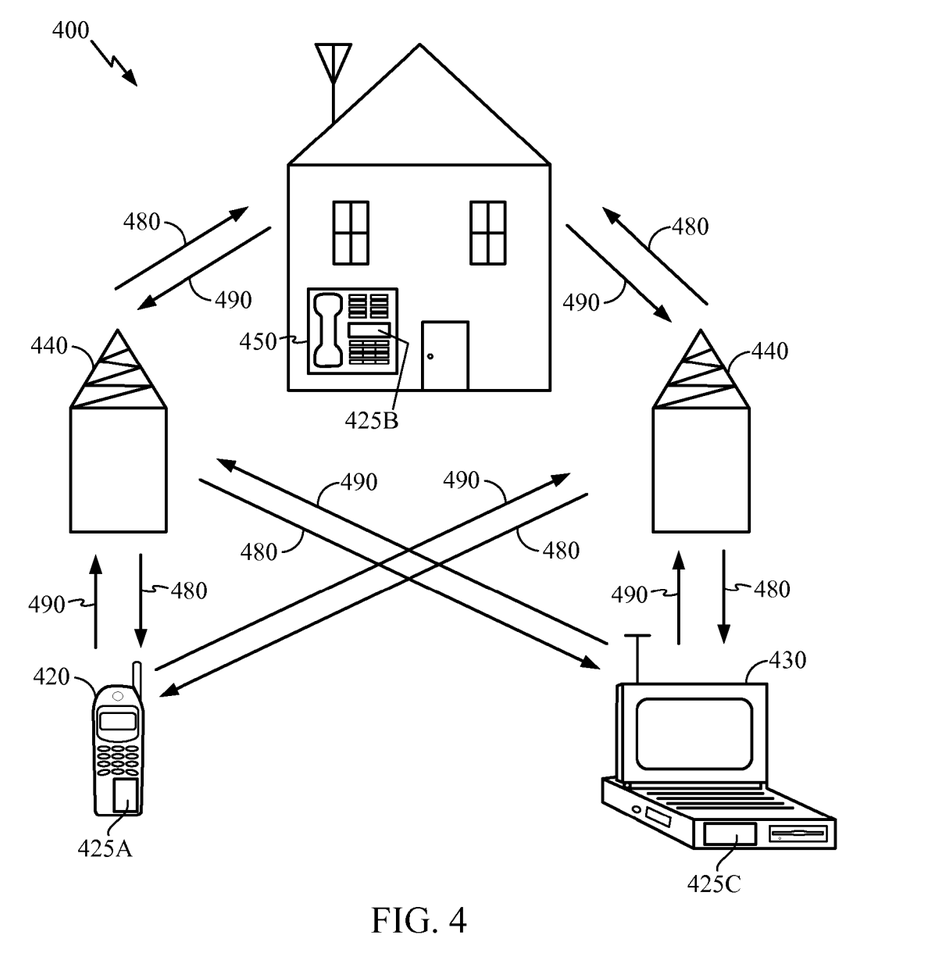
FIG. 4 is a block diagram showing an exemplary wireless communication system in which an embodiment of the disclosure may be advantageously employed.

FIG. 4 is a block diagram showing an exemplary wireless communication system 400 in which an embodiment of the disclosure may be advantageously employed. For purposes of illustration, FIG. 4 shows three remote units 420, 430, and 450 and two base stations 440. It will be recognized that wireless communication systems may have many more remote units and base stations. Remote units 420, 430, and 450 include IC devices 425A, 425C and 425B, that include the disclosed MTJ device. It will be recognized that any device containing an IC may also include the MTJ device disclosed here, including the base stations, switching devices, and network equipment. FIG. 4 shows forward link signals 480 from the base station 440 to the remote units 420, 430, and 450 and reverse link signals 490 from the remote units 420, 430, and 450 to base stations 440.

In FIG. 4, remote unit 420 is shown as a mobile telephone, remote unit 430 is shown as a portable computer, and remote unit 450 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or any other device that stores or retrieves data or computer instructions, or any combination thereof. Although FIG. 4 illustrates remote units according to the teachings of the disclosure, the disclosure is not limited to these exemplary illustrated units. Embodiments of the disclosure may be suitably employed in any device which includes MTJ devices.

Figure 5:
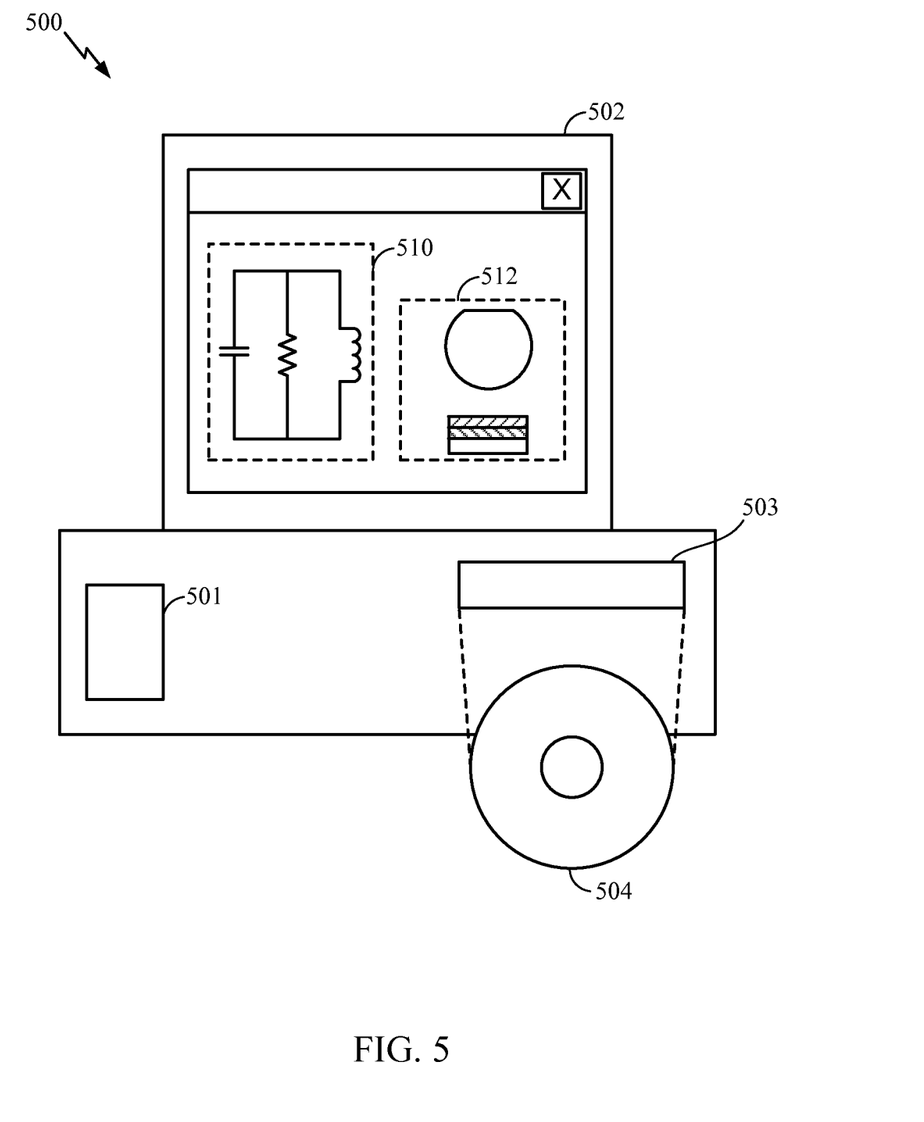
FIG. 5 is a block diagram illustrating a design workstation used for circuit, layout, and logic design of a semiconductor component according to one embodiment.

FIG. 5 is a block diagram illustrating a design workstation used for circuit, layout, and logic design of a semiconductor component, such as an MTJ as disclosed above. A design workstation 500 includes a hard disk 501 containing operating system software, support files, and design software such as Cadence or OrCAD. The design workstation 500 also includes a display to facilitate design of a circuit 510 or a semiconductor component 512 such an MTJ. A storage medium 504 is provided for tangibly storing the circuit design 510 or the semiconductor component 512. The circuit design 510 or the semiconductor component 512 may be stored on the storage medium 504 in a file format such as GDSII or GERBER. The storage medium 504 may be a CD-ROM, DVD, hard disk, flash memory, or other appropriate device. Furthermore, the design workstation 500 includes a drive apparatus 503 for accepting input from or writing output to the storage medium 504.

Data recorded on the storage medium 504 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 504 facilitates the design of the circuit design 510 or the semiconductor component 512 by decreasing the number of processes for designing semiconductor wafers.

For a firmware and/or software implementation, the methodologies may be implemented with modules (e.g., procedures, functions, and so on) that perform the functions described herein. Any machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to any type of long term, short term, volatile, nonvolatile, or other memory and is not to be limited to any particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer; disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although specific circuitry has been set forth, it will be appreciated by those skilled in the art that not all of the disclosed circuitry is required to practice the disclosure. Moreover, certain well known circuits have not been described, to maintain focus on the disclosure.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A magnetic tunnel junction, comprising:
   a bottom metal;
   a planarized bottom electrode on the bottom metal having a top surface, the top surface being coplanar with a surrounding layer;
   a first insulating layer surrounding and contacting the bottom electrode;
   a material stack on the bottom electrode, the material stack being smaller than the bottom electrode and aligned substantially with the bottom metal;
   a top electrode on the material stack;
   a second insulating layer surrounding and contacting the material stack and also contacting both the bottom electrode and the top electrode; and
   a third insulating layer surrounding and contacting the second insulating layer and also contacting both the top electrode and the first insulating layer.

2. The magnetic tunnel junction of claim 1, in which the top electrode is 100 nm to 150 nm is width.

3. The magnetic tunnel junction of claim 1, in which the bottom electrode is a material selected from a group consisting of tungsten, copper, tantalum, and tantalum nitride.

4. The magnetic tunnel junction of claim 1, in which the bottom electrode has a substantially flat surface.

5. The magnetic tunnel junction of claim 1, further comprising an underlayer between the bottom electrode and the material stack.

6. The magnetic tunnel junction of claim 1, further comprising an etch stop layer adjacent with a portion of the bottom metal, the bottom electrode being on the etch stop layer and the bottom metal.

7. The magnetic tunnel junction of claim 1, in which the material stack comprises a first ferromagnetic layer, a tunnel barrier layer, and a second ferromagnetic layer.

8. The magnetic tunnel junction of claim 1, in which the magnetic tunnel junction is integrated into a magnetic random access memory (MRAM).

9. The magnetic tunnel junction of claim 8, in which the MRAM is integrated into a set top box, music player, video player, entertainment unit, navigation device, communications device, personal digital assistant (PDA), fixed location data unit, and/or a computer.

10. A magnetic tunnel junction, comprising:
    a bottom metal;
    planarized means for coupling on the bottom metal having a top surface, the top surface being coplanar with a surrounding layer;
    a first insulating layer surrounding and contacting the coupling means;
    a material stack on the coupling means, the material stack being patterned to a size smaller than the coupling means and the material stack being aligned substantially with the bottom metal;
    a top electrode on the material stack;
    a second insulating layer surrounding and contacting the material stack and also contacting both the bottom electrode and the top electrode; and
    a third insulating layer surrounding and contacting the second insulating layer and also contacting both the top electrode and the first insulating layer.

11. The magnetic tunnel junction of claim 10, in which the coupling means has a substantially flat surface.

12. The magnetic tunnel junction of claim 10, in which the magnetic tunnel junction is integrated into a set top box, music player, video player, entertainment unit, navigation device, communications device, personal digital assistant (PDA), fixed location data unit, and/or a computer.

* * * * *